US012619275B2

(12) United States Patent
Iyengar et al.

(10) Patent No.: US 12,619,275 B2
(45) Date of Patent: May 5, 2026

(54) ACCESS TO MULTIPLE TIMING DOMAINS

(71) Applicant: Intel Corporation, Santa Clara, CA (US)

(72) Inventors: Srinivasan S. Iyengar, Fremont, CA (US); Paul Kappler, Hillsboro, OR (US); Alon Meir, Jerusalem (IL); Joseph Mirsky, Mitzpe Yericho (IL); Thomas Ng, Vancouver, WA (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 17/508,358

(22) Filed: Oct. 22, 2021

(65) Prior Publication Data

US 2022/0043475 A1    Feb. 10, 2022

(51) Int. Cl.
*G06F 1/10* (2006.01)
*G06F 1/08* (2006.01)
*G06F 15/78* (2006.01)
*H03K 19/173* (2006.01)

(52) U.S. Cl.
CPC .................. *G06F 1/10* (2013.01); *G06F 1/08* (2013.01); *G06F 15/7825* (2013.01); *H03K 19/1737* (2013.01)

(58) Field of Classification Search
CPC ...................................... G06F 1/12; G06F 1/10
See application file for complete search history.

(56) References Cited

U.S. PATENT DOCUMENTS

| | | | | |
|---|---|---|---|---|
| 6,295,632 B1 * | 9/2001 | McBride | ................ | G06F 30/33 |
| | | | | 716/108 |
| 6,831,919 B1 * | 12/2004 | Choi | ................... | H04L 12/5601 |
| | | | | 370/545 |
| 10,700,669 B2 * | 6/2020 | Baladhandapani | .. | H03K 21/026 |
| 11,581,881 B1 * | 2/2023 | Azad | ...................... | H03K 5/023 |
| 2009/0125771 A1 * | 5/2009 | Duggal | .......... | G01R 31/318594 |
| | | | | 326/16 |
| 2009/0232133 A1 * | 9/2009 | Yu | ........................... | H04J 3/047 |
| | | | | 370/389 |
| 2012/0139590 A1 * | 6/2012 | Myers | ................... | G06F 1/3237 |
| | | | | 327/113 |
| 2012/0260015 A1 | 10/2012 | Gay et al. | | |
| 2017/0161228 A1 * | 6/2017 | Wang | ................... | G06F 13/4282 |
| 2017/0214604 A1 * | 7/2017 | Qiao | ...................... | H04L 45/24 |
| 2017/0337152 A1 * | 11/2017 | Hanchinal | .......... | G06F 13/4295 |
| 2018/0181525 A1 * | 6/2018 | Iyer | ..................... | G06F 13/1673 |
| 2019/0303318 A1 | 10/2019 | Mao et al. | | |
| 2020/0311009 A1 * | 10/2020 | Tu | ....................... | G06F 13/4282 |
| 2021/0226766 A1 * | 7/2021 | Arunachalam | ..... | H04W 56/001 |

* cited by examiner

*Primary Examiner* — Phil K Nguyen
(74) *Attorney, Agent, or Firm* — Compass IP Law PC

(57) ABSTRACT

Examples described herein relate to a system-on-a-chip (SoC) comprising: a multiplexer integrated into the SoC, wherein the multiplexer comprises one or more physical layer (PHY) circuitries and the multiplexer is to receive one or more clock signals and distribute the one or more clock signals to the one or more PHY circuitries based on a clock transfer configuration to support multiple clock distribution schemes. In some examples, the one or more clock signals are received from at least one host comprising one or more of: a central processing unit (CPU), graphics processing unit (GPU), accelerator, memory pool, network-attached appliance, and/or storage device.

21 Claims, 14 Drawing Sheets

| Configurations | Host PCIE REFCLK Selection | | | | Platform Usage |
| --- | --- | --- | --- | --- | --- |
| | PHY[0] | PHY[1] | PHY[2] | PHY[3] | |
| x16 | REFCLK[0] | REFCLK[0] | REFCLK[0] | REFCLK[0] | Standard Single Endpoint |
| x8x8 | REFCLK[0] | REFCLK[0] | REFCLK[1] | REFCLK[1] | Dual Purpose HW Config |
| x8x8 | REFCLK[0] | REFCLK[0] | REFCLK[2] | REFCLK[2] | OCP NIC3.0, Dual Purpose HW Config |
| x8x4x4 | REFCLK[0] | REFCLK[0] | REFCLK[1] | REFCLK[2] | OCP NIC3.0, Dual Purpose HW Config |
| x8x4x4 | REFCLK[0] | REFCLK[0] | REFCLK[2] | REFCLK[3] | Dual Purpose HW Config |
| 4x4 | REFCLK[0] | REFCLK[1] | REFCLK[2] | REFCLK[3] | Multihost application – 4 Cabled Endpoint |
| X8x8 | REFCLK[0] | REFCLK[0] | REFCLK[0] | REFCLK[0] | Shared Common Clock 2x8 |
| X8x4x4 | REFCLK[0] | REFCLK[0] | REFCLK[0] | REFCLK[0] | Shared Common Clock 1x8, 2x4 |
| X8x4x4 | REFCLK[0] | REFCLK[0] | REFCLK[2] | REFCLK[2] | Shared Common Clock on Root Port |
| 4x4 | REFCLK[0] | REFCLK[0] | REFCLK[0] | REFCLK[0] | Multihost application – 4 Root Port or 4 Endpoint |

FIG. 2

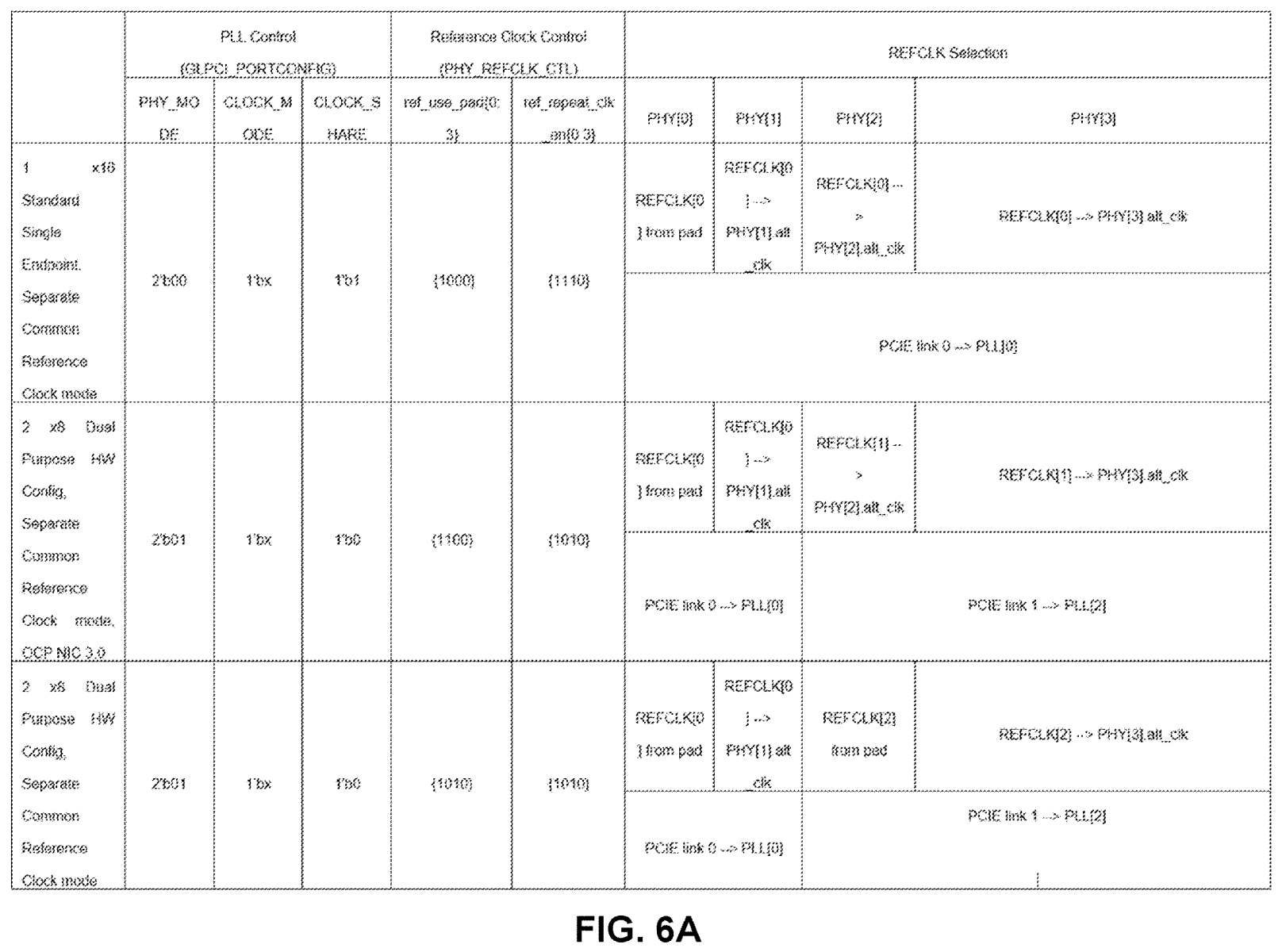

| | PLL Control ([3].PCI_PORTCONFIG) | | | Reference Clock Control (PHY_REFCLK_CTL) | | REFCLK Selection | | | |
|---|---|---|---|---|---|---|---|---|---|
| | PHY_MODE | CLOCK_MODE | CLOCK_SHARE | ref_use_pad[0:3] | ref_repeat_clk_en[0:3] | PHY[0] | PHY[1] | PHY[2] | PHY[3] |
| 1 x16 Standard Single Endpoint, Separate Common Reference Clock mode | 2'b00 | 1'bx | 1'b1 | {1000} | {1110} | REFCLK[0] from pad | REFCLK[0] --> PHY[1].alt_clk | REFCLK[0] --> PHY[2].alt_clk | REFCLK[0] --> PHY[3].alt_clk |
| | | | | | | PCIE link 0 --> PLL[0] | | | |
| 2 x8 Dual Purpose HW Config, Separate Common Reference Clock mode OCP NIC 3.0 | 2'b01 | 1'bx | 1'b0 | {1100} | {1010} | REFCLK[0] from pad | REFCLK[0] --> PHY[1].alt_clk | REFCLK[1] --> PHY[2].alt_clk | REFCLK[1] --> PHY[3].alt_clk |
| | | | | | | PCIE link 0 --> PLL[0] | | PCIE link 1 --> PLL[2] | |
| 2 x8 Dual Purpose HW Config, Separate Common Reference Clock mode | 2'b01 | 1'bx | 1'b0 | {1010} | {1010} | REFCLK[0] from pad | REFCLK[0] --> PHY[1].alt_clk | REFCLK[2] from pad | REFCLK[2] --> PHY[3].alt_clk |
| | | | | | | PCIE link 0 --> PLL[0] | | PCIE link 1 --> PLL[2] | |

FIG. 6A

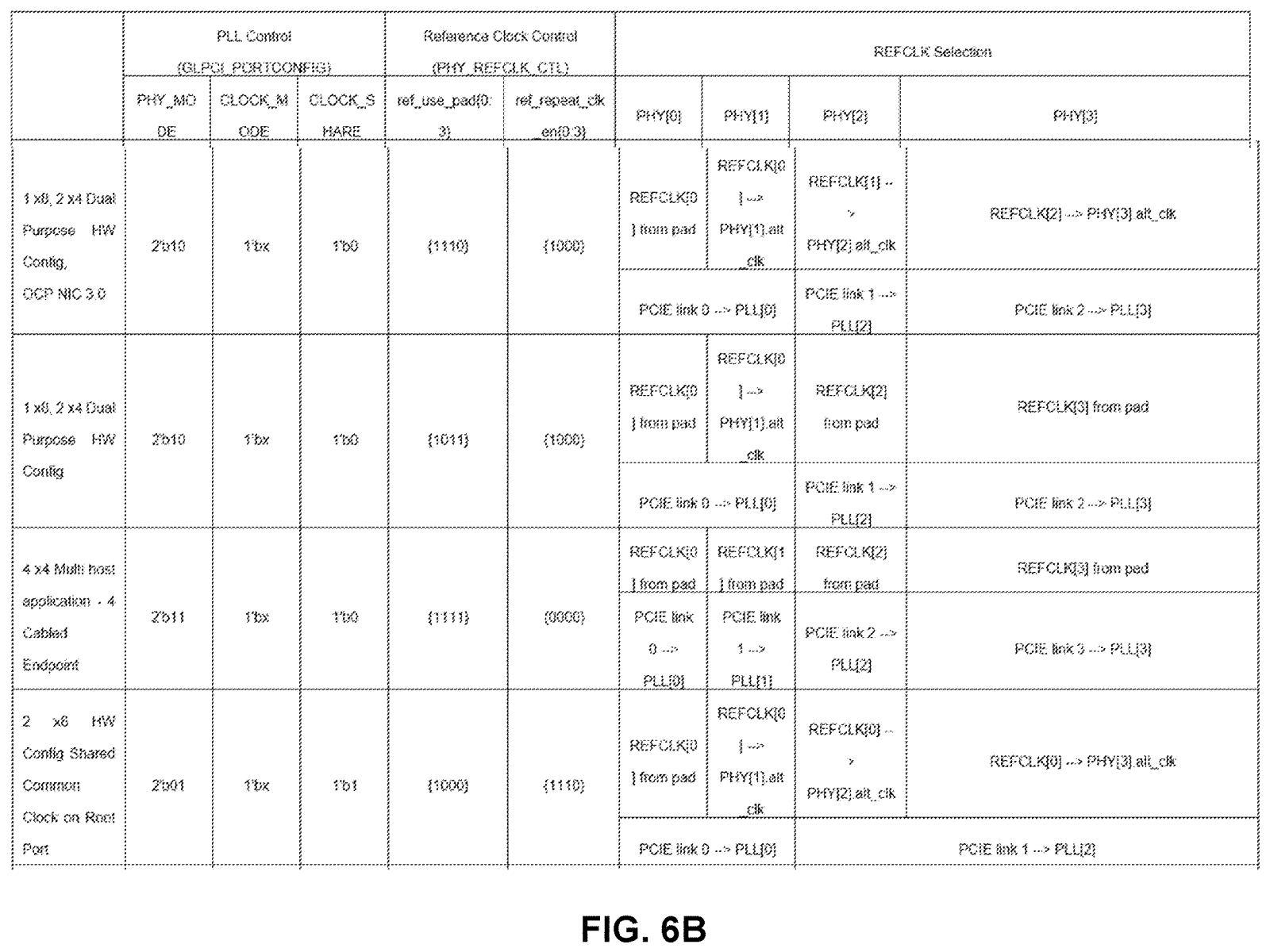

|  | PLL Control (GLPCI_PORTCONFIG) | | | Reference Clock Control (PHY_REFCLK_CTL) | | REFCLK Selection | | | |
|---|---|---|---|---|---|---|---|---|---|
|  | PHY_MODE | CLOCK_MODE | CLOCK_SHARE | ref_use_pad[0:3] | ref_repeat_clk_en[0:3] | PHY[0] | PHY[1] | PHY[2] | PHY[3] |
| 1 x8, 2 x4 Dual Purpose HW Config, OCP NIC 3.0 | 2'b10 | 1'bx | 1'b0 | {1110} | {1000} | REFCLK[0] from pad / PCIE link 0 -> PLL[0] | REFCLK[0] -> PHY[1].alt_clk / PCIE link 0 -> PLL[0] | REFCLK[1] -> PHY[2].alt_clk / PCIE link 1 -> PLL[2] | REFCLK[2] -> PHY[3].alt_clk / PCIE link 2 -> PLL[3] |
| 1 x8, 2 x4 Dual Purpose HW Config | 2'b10 | 1'bx | 1'b0 | {1011} | {1000} | REFCLK[0] from pad / PCIE link 0 -> PLL[0] | REFCLK[1] -> PHY[1].alt_clk / PCIE link 0 -> PLL[0] | REFCLK[2] from pad / PCIE link 1 -> PLL[2] | REFCLK[3] from pad / PCIE link 2 -> PLL[3] |
| 4 x4 Multi host application - 4 Cabled Endpoint | 2'b11 | 1'bx | 1'b0 | {1111} | {0000} | REFCLK[0] from pad / PCIE link 0 -> PLL[0] | REFCLK[1] from pad / PCIE link 1 -> PLL[1] | REFCLK[2] from pad / PCIE link 2 -> PLL[2] | REFCLK[3] from pad / PCIE link 3 -> PLL[3] |
| 2 x8 HW Config Shared Common Clock on Riser Port | 2'b01 | 1'bx | 1'b1 | {1000} | {1110} | REFCLK[0] from pad / PCIE link 0 -> PLL[0] | REFCLK[0] -> PHY[1].alt_clk | REFCLK[0] -> PHY[2].alt_clk | REFCLK[0] -> PHY[3].alt_clk / PCIE link 1 -> PLL[2] |

FIG. 6B

| PLL Control (GLPCI_PORT_CONFIG) | | | Reference Clock Control (PHY_REFCLK_CTL) | | REFCLK Selection | | | |
|---|---|---|---|---|---|---|---|---|
| PHY_MODE | CLOCK_MODE | CLOCK_SHARE | ref_use_pad[3] | ref_repeat_clk_en[0:3] | PHY[0] | PHY[1] | PHY[2] | PHY[3] |
| 1 x8, 2 x4 HW Config Shared Common Clock on Root Port | 2'b10 | 1'b0 | 1'b1 | {1000} | {1110} | REFCLK[0] from pad | REFCLK[0] 1 --> PHY[1].all_ck | REFCLK[0] --> ^ PHY[2].all_ck | REFCLK[0] --> PHY[3].all_ck |
| | | | | | PCIE link 0 --> PLL[0] | PCIE link 0 --> PLL[0] | PCIE link 1 --> PLL[2] | PCIE link 2 --> PLL[3] |
| 1 x8, 2 x4 Shared Common Clock on Root Port | 2'b10 | 1'b1 | 1'b1 | {1010} | {1010} | REFCLK[0] from pad | REFCLK[0] 1 --> PHY[1].all_ck | REFCLK[2] from pad | REFCLK[2] --> PHY[3].all_ck |
| | | | | | PCIE link 0 --> PLL[0] | PCIE link 0 --> PLL[0] | PCIE link 1 --> PLL[2] | PCIE link 2 --> PLL[3] |
| 4 x4 Multi host application - 4 Root Port or 4 Endpoint | 2'b11 | 1'bx | 1'b1 | {1000} | {1110} | REFCLK[0] from pad | REFCLK[0] 1 --> PHY[1].all_ck | REFCLK[0] --> ^ PHY[2].all_ck | REFCLK[0] --> PHY[3].all_ck |
| | | | | | PCIE link 0 --> PLL[0] | PCIE link 1 --> PLL[1] | PCIE link 2 --> PLL[2] | PCIE link 3 --> PLL[3] |

FIG. 6C

CONFIGURE MULTIPLEXER TO OUTPUT CLOCK SIGNAL BASED ON A SOURCE
CLOCK SIGNAL AND CONFIGURATION
702

CONFIGURE MULTIPLEXER USING REGISTER VALUES

OUTPUT ONE OR MORE CLOCK SIGNALS BASED ON CONFIGURATION
704

800

ACCESS TO MULTIPLE TIMING DOMAINS

BACKGROUND

Data centers provide computing resources for Internet-connected devices. Computing systems in a data center can utilize device-to-device connections for communications among devices. Various protocols and standards specify manners of device-to-device connections. Open Compute Project (OCP) is an organization involved in designing device-to-device connections for servers, data storage, racks, and switches.

FIG. 1 illustrates a multi-host networking system based on Open Compute Project (OCP) NIC 3.0 version 1.1.0 (2021), where the various Peripheral Component Interconnect Express (PCIe) configurations (e.g., x16 (16 PCIe lanes per connector), x8 (8 PCIe lanes per connector), x4 (4 PCIe lanes per connector), and so forth) for host connectivity utilize a multiplexer connected to a platform circuit board and the multiplexer receives PCIe analog reference clock inputs from one or more host systems. For the circuit board to support configurations of 2 x8 or 4 x4 clock signals, a platform level clock multiplexer is implemented. For example, some platforms utilize a platform level clock multiplexer to support 2 x8 clock or 4 x4 clocks on the same reference board design. In addition, the platform or its microcontroller switches between various platform configurations to support configurations of x16, x8, or x4.

Table of FIG. 2 outlines systems, based on OCP NIC 3.0 version 1.1.0, with multiple hosts connected to a network interface card (NIC) that support PCIe connectivity to more than one host via physical layer interfaces (PHY[0] to PHY[1]) of the NIC. The table of FIG. 2 shows different platform configurations that support multi-host, accelerator, storage (including hybrid storage (e.g., a mixture of random access memory, solid state drives (SSDs), and hard drive disks (HDD)), and hybrid systems. In some known implementations, supporting these different modes involves circuit board level changes, such as changes to jumpers or wires or unique reference boards.

BRIEF DESCRIPTION OF THE DRAWINGS

FIG. 2 shows different reference clock platform configurations.

FIGS. 6A-6C depict an example configuration.

DETAILED DESCRIPTION

Some examples provide a multiplexer integrated into a system on chip (SoC) or semiconductor die of a device and the multiplexer supports clock receipt from a single host central processing unit (CPU) as well as independent clock receipt from multiple host CPUs. The integrated multiplexer can support common clocking from a single host and common but independent clocking from multiple hosts for a device interface. The multiplexer, device interface, and device can be integrated in the same SoC. The integrated multiplexer can transfer one or more clock signals from one or more host systems and support configurations set forth, at least, in OCP NIC 3.0 version 1.1.0 (as well as earlier versions, later versions, and derivatives thereof). A platform with one set of circuit board signal routing can support multiple clock routing configurations with a single set of clock routing from one or more host devices to physical layer interfaces (PHYs) of the device interface. Some examples can utilize the integrated multiplexer to provide clock signals to the device interface that can change between different clock routing options. A circuit board that provides connectivity between one or more CPUs and the device SoC need not be changed to support different clock routing options, but in some examples, the circuit board may be modified to support different clock routing options.

Figure 1:
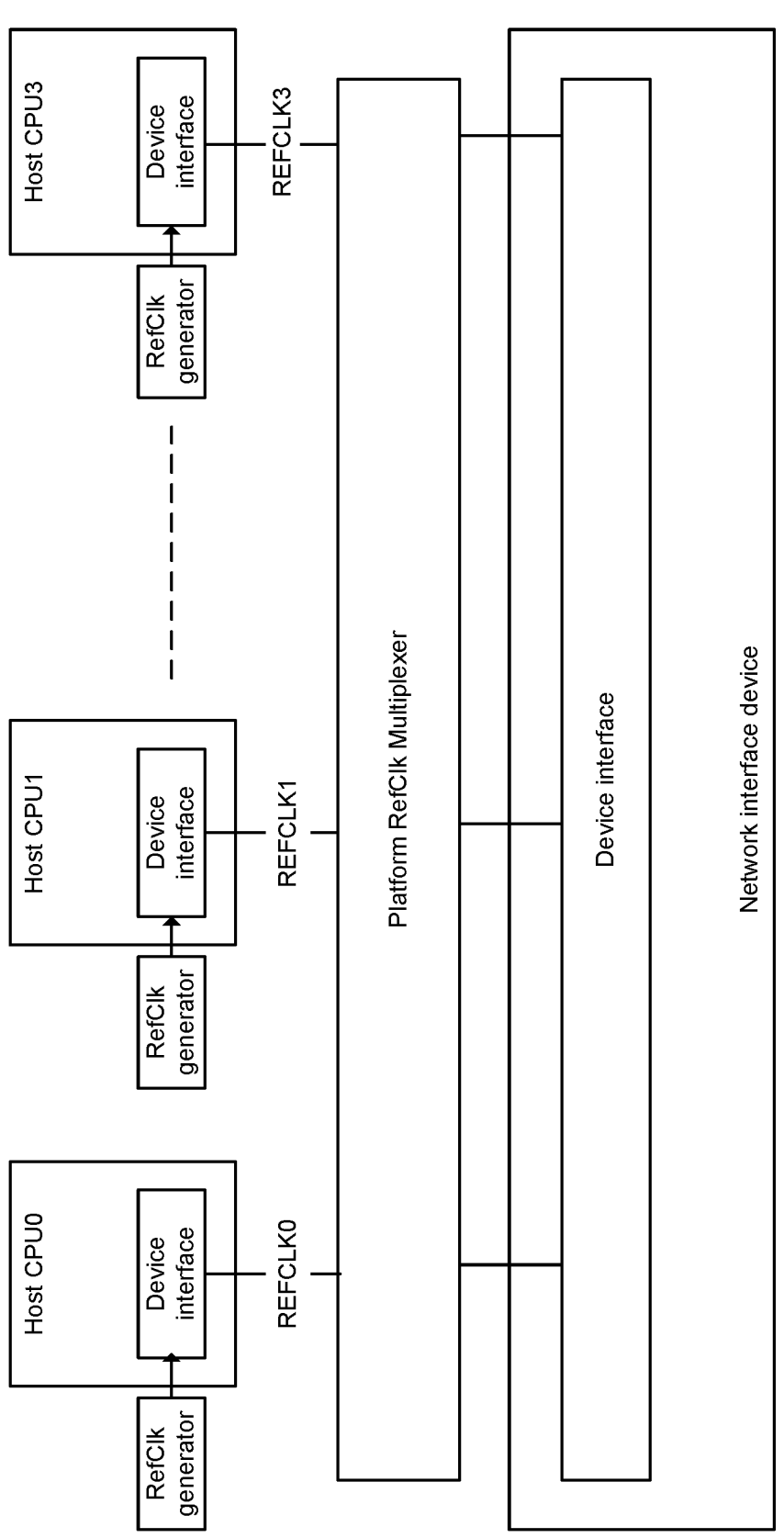
FIG. 1 illustrates a multi-host networking system.
Figure 3:
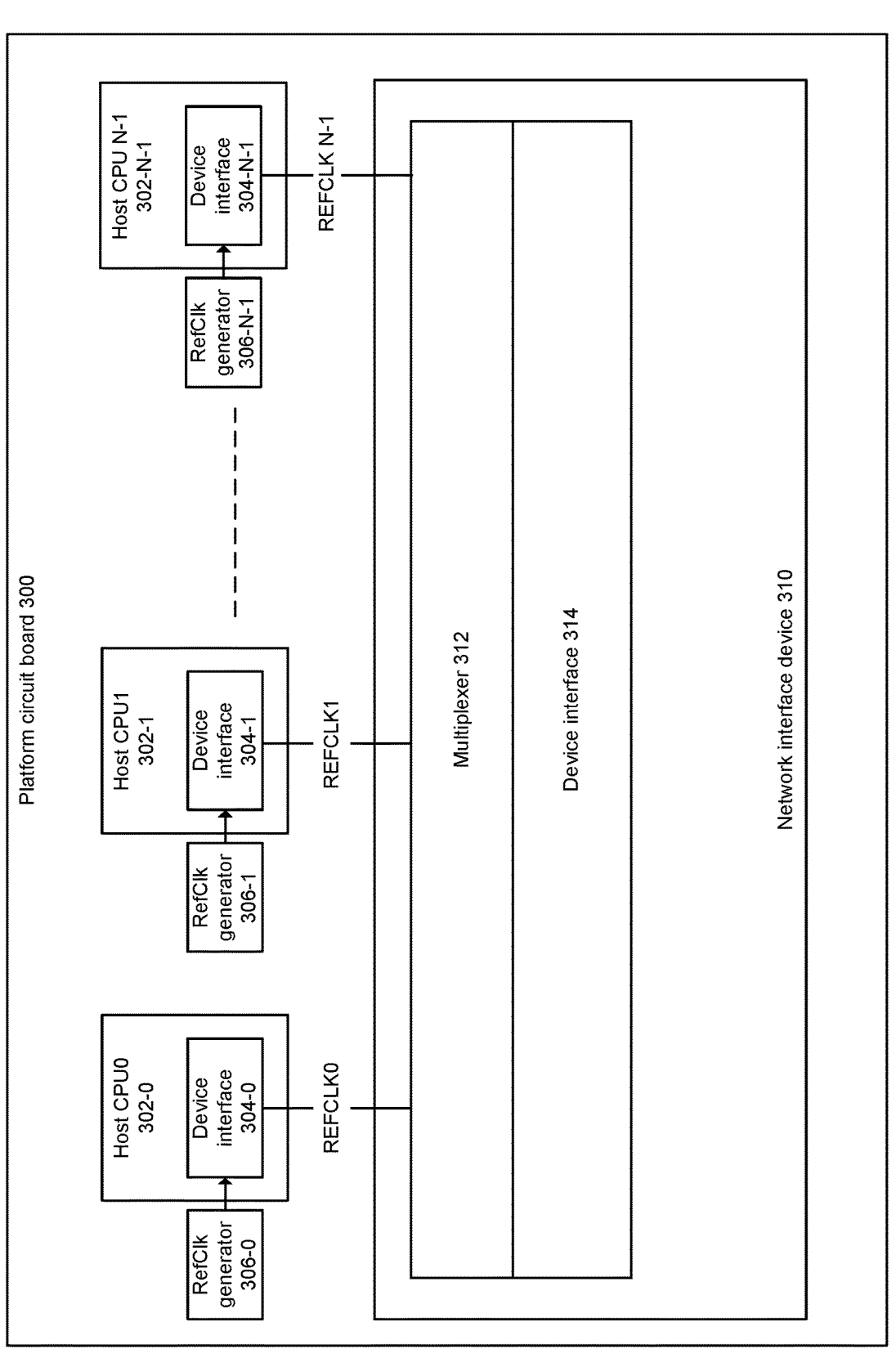
FIG. 3 depicts an example system.

FIG. 3 depicts an example system. Platform circuit board 300 can include a printed circuit board (PCB), motherboard, or other circuit board with conductive connectors that provide communication via electrical and/or optical signals among host CPU0 302-0 to host CPU N–1 302-N–1 and network interface device 310. One or more of host CPU0 302-0 to host CPU N–1 302-N–1 can include one or more processor, central processing unit (CPU), core, graphics processing unit (GPU), general purpose GPU (GPGPU), accelerator, field programmable gate array (FPGA), application specific integrated circuit (ASIC), programmable hardware devices, memory, and interconnection devices. Note that one or more of host CPU0 302-0 to host CPU N–1 302-N–1 can execute virtual machines, containers, microservices, serverless applications, or service mesh and access network interface device 310 to transmit or receive packets.

In some examples, clock generators 306-0 to 306-N–1 can provide clock signals to respective device interfaces 304-0 to 304-N–1 of host CPU0 302-0 to host CPU N–1 302-N–1. Clock generators 306-0 to 306-N–1 can be conductively coupled to respective host CPU0 302-0 to host CPU N–1 302-N–1 via platform circuit board 300 or can be integrated into host CPU0 302-0 to host CPU N–1 302-N–1.

In accordance with a configuration described herein, multiplexer 312 can provide clock signals into device interface 314 and the provided clock signals are based on one or more reference clock signals from host CPU0 302-0 to host CPU N–1 302-N–1. One or more reference clock signals from host CPU0 302-0 to host CPU N–1 302-N–1 can be used for one or more PCIe links or lanes of device interface 314.

Network interface device 310 can be implemented as a system on chip (SoC) and integrated on a single circuit with multiplexer 312 and device interface 314. In some examples, host CPU0 302-0 to host CPU N–1 302-N–1 can be communicatively coupled to network interface device 310 using an Embedded Multi-die Interconnect Bridge (EMIB). In some examples, network interface device 310 and multiplexer 312 can be formed in a same silicon-based semiconductor device.

Network interface device 310 can include functionality of one or more of: network interface controller (NIC), a remote direct memory access (RDMA)-enabled NIC, SmartNIC, router, switch, forwarding element, infrastructure processing unit (IPU), data processing unit (DPU), network-attached appliance (e.g., storage, memory, accelerator, processors, security), and so forth. While examples are described with respect to a network interface device, other types of devices can utilize one or more clock signals provided by a multiplexer, such as accelerators, storage devices, hybrid storage devices, memory pools, memory devices, and so forth.

As described herein, integrated multiplexer 312 can include multiple physical layer interfaces (PHYs) to receive clock signals from one or more hosts 302-0 to 302-N–1 and transfer clock signals from a host as an output to device interface 314 and/or provide the clock signal(s) to another PHY. For example, logical port clock numbering of OCP NIC 3.0 or physical lane clock numbering can be supported by integrated multiplexer 312. Integrated multiplexer 312 can provide one or more signal routings to provide a flexible pluggable platform with one or more sets of clock routings from platform circuit board 300 which supports single and/or multiple host use cases.

Some examples of an SoC with integrated multiplexer 312 can be used in a multiple host platform usage models at least in data center, cloud, or storage applications that are based on a version or variation of the OCP NIC standard specification.

Platform level complexity associated with managing signal integrity to support PCIe Generation 4 or 5 clocking requirements may be managed by integrated multiplexer 312. However, some examples, can also utilize a clock multiplexer attached and connected to circuit board 300. By use of integrated multiplexer 312, some examples do not use a clock multiplexer attached and connected to circuit board 300 to support OCP NIC version 1.1.0 (as well as earlier versions, later versions, and derivatives thereof) and other configurations. Cost and board space savings can be realized by not using an on-board multiplexer. Moving the platform level hardware such as the clock multiplexers and its supporting components (e.g., resistors, capacitors, etc.) into integrated multiplexer 312 can reduce platform cost and free circuit board area for other uses.

In some examples, integrated multiplexer 312 can support PCIe common clocking, Separate RefClk with no Spread Spectrum (SRNS), or Separate RefClk with Independent Spread Spectrum Clock (SRIS) in PCIe systems. In some examples, integrated multiplexer can support PCIe refclk clock multiplexing and pipe clock (PCLK) multiplexing (e.g., from PHY Interface for the PCI Express (PIPE) Specification version 5.0, and preceding, succeeding, or derivative versions thereof). Control of a reference clock (refclk) mode performed by integrated multiplexer 312 can be implemented using a fuse or system firmware to support various clock routing modes.

Some implementations of multiplexer 312 can provide a cleaner clock than that of a multiplexer attached and connected to board 300 because multiplexer 312 is part of an SoC instead of connected using external connection, which can introduce noise. A common clocking and shared clocking scheme can reduce a number of clock buffers and multiplexer used in multi-host systems.

Figure 4A:
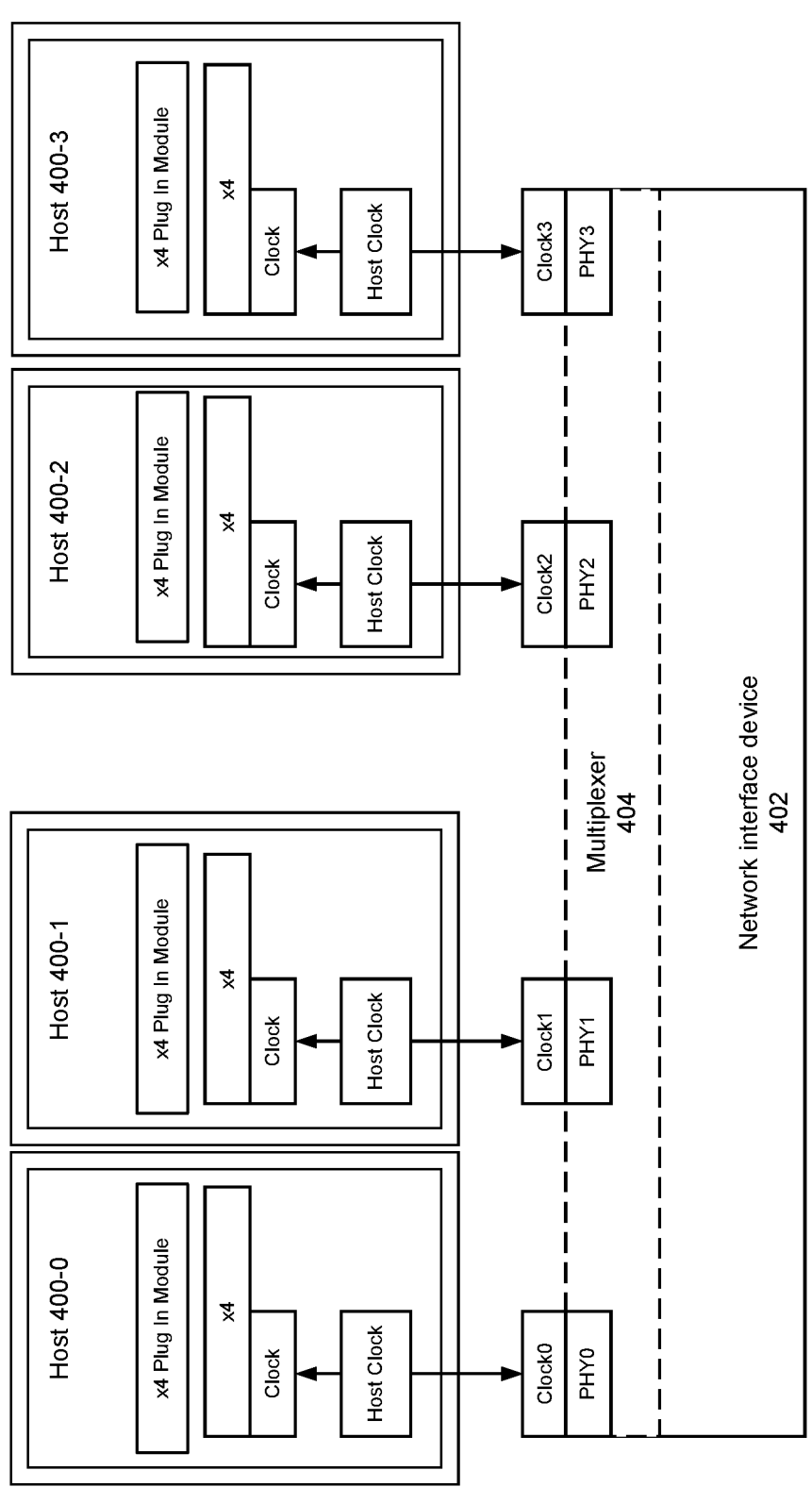
FIG. 4A depicts an example configuration that provides for receipt of multiple independent clock signals from multiple hosts.

FIG. 4A depicts an example configuration that provides for receipt of multiple independent clock signals from multiple hosts. One or more of hosts 400-0 to 400-3 can be configured to connect with network interface device 402 as an x4 plug-in module, as described at least in OCP NIC 3.0 version 1.1.0 (as well as earlier versions, later versions, and derivatives thereof). In the example of FIG. 4A, integrated multiplexer 404 can support a 4×4 configuration of OCP NIC 3.0 version 1.1.0 (as well as earlier versions, later versions, and derivatives thereof). For example, hosts 400-0 to 400-3 can provide respective clock signals 0 to 3 (shown as Clock0 to Clock3) to respective PHY0 to PHY3 of network interface device 402. Integrated multiplexer 404 can include PHY0 to PHY3 and can be integrated into a same SoC as that of network interface device 402. In some examples, multiplexer 404 can be integrated with a device interface and PHY0 to PHY3 can be part of lanes of the device interface. In some examples, the device interface can support x16 lanes, or other numbers of lanes.

Figure 4B:
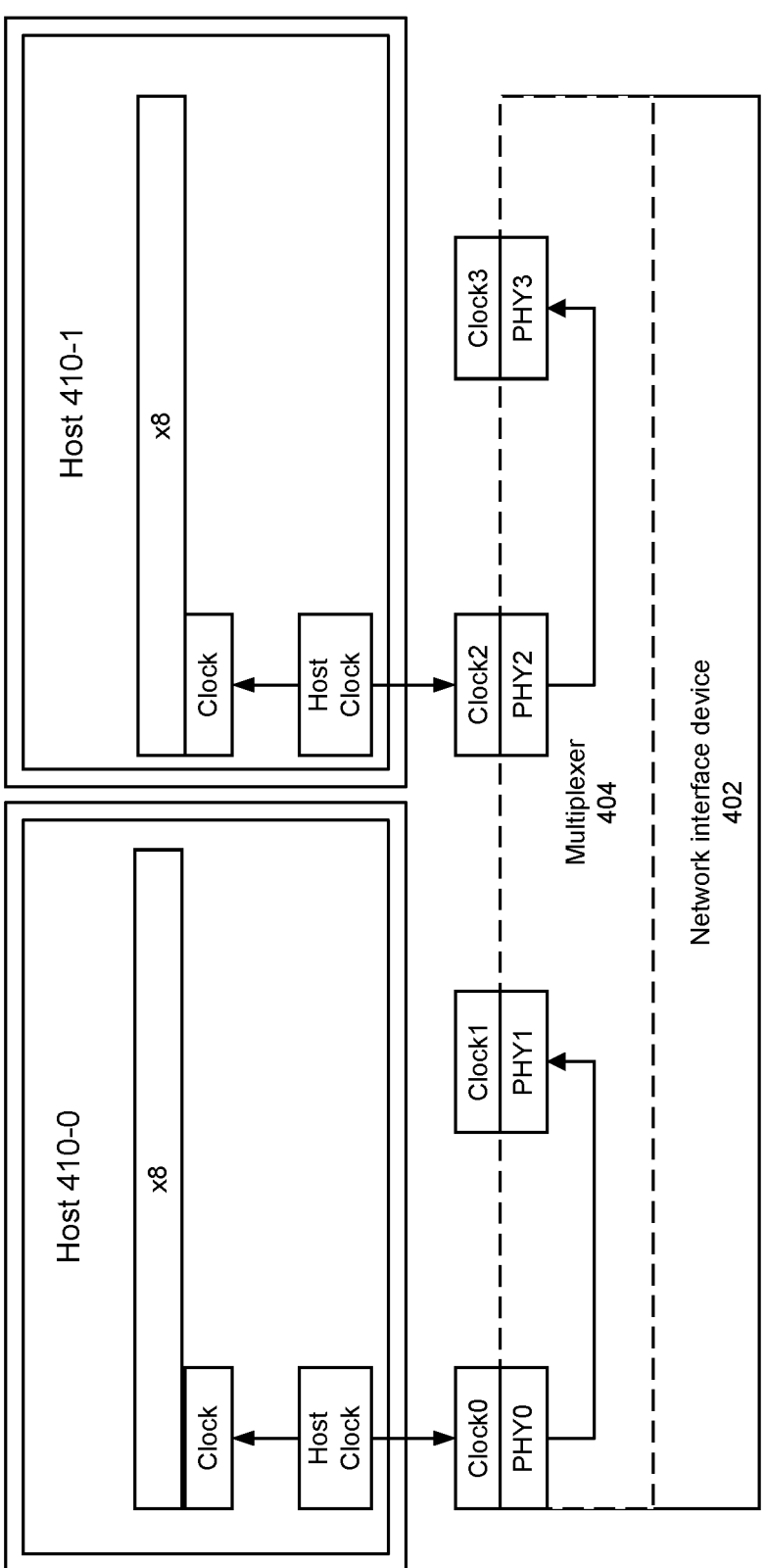
FIG. 4B depicts an example configuration that provides for receipt of multiple independent clock signals from multiple hosts.

FIG. 4B depicts an example configuration that provides for receipt of multiple independent clock signals from multiple hosts. One or more of hosts 410-0 to 410-3 can be configured to connect with network interface device 402 as an x8 plug-in module, as described at least in OCP NIC 3.0 version 1.1.0 (as well as earlier versions, later versions, and derivatives thereof). In the example of FIG. 4B, integrated multiplexer 404 can support an x8x8 configuration of OCP NIC 3.0 version 1.1.0 (as well as earlier versions, later versions, and derivatives thereof). In this example, hosts 410-0 and 410-1 can provide respective clock signals 0 and 2 (shown as Clock0 and Clock2) to respective PHY0 and PHY2 of multiplexer 404. Integrated multiplexer 404 can include PHY0 to PHY3 and can be integrated into a same SoC as that of network interface device 402. Clock signal Clock0 from host 410-0 can be routed to PHY1 and clock signal Clock 2 from host 410-2 can be routed to PHY3. For example, PHY0 can receive clock signal 0 Clock0 and also route clock signal Clock0 to PHY1 to supply clock signal Clock1. PHY2 can receive clock signal 2 Clock2 and also route clock signal Clock2 to PHY3 to supply clock signal Clock3. The flexible multiplexer 404 can accept multiple clock signals from x8 systems as that of the system of FIG. 4B using a same circuit board that connects hosts 410-0 and 410-1 to network interface device 402.

Figure 4C:
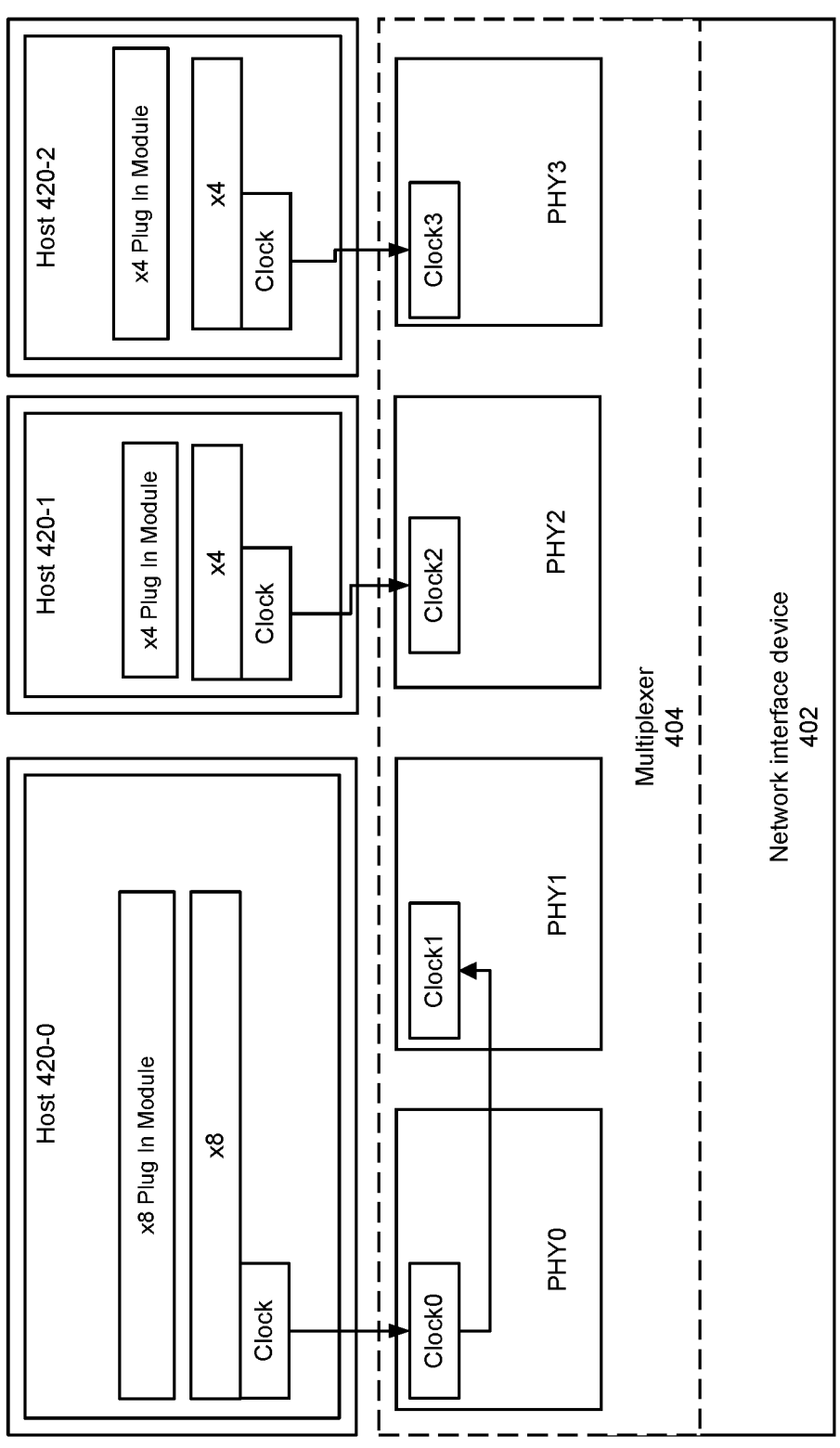
FIG. 4C depicts an example configuration that provides for receipt of multiple independent clock signals from multiple hosts.

FIG. 4C depicts an example configuration that provides for receipt of multiple independent clock signals from multiple hosts. Hosts 420-0 to 420-2 can be configured to connect with network interface device 402 as an x8x4x4 plug-in module, as described at least in OCP NIC 3.0 version 1.1.0 (as well as earlier versions, later versions, and derivatives thereof). In this example, integrated multiplexer 404 can support an x8x4x4 configuration of OCP NIC 3.0 version 1.1.0 (as well as earlier versions, later versions, and derivatives thereof). For example, PHY0 of integrated multiplexer 404 can receive clock signal 0 (Clock0) from host 0 and also route the clock signal to PHY1 as clock signal 1 (Clock1). For example, a PHY2 can receive clock signal 2 (Clock2) from host 2 and PHY3 can receive clock signal 3 from host 3 (Clock3).

Figure 4D:
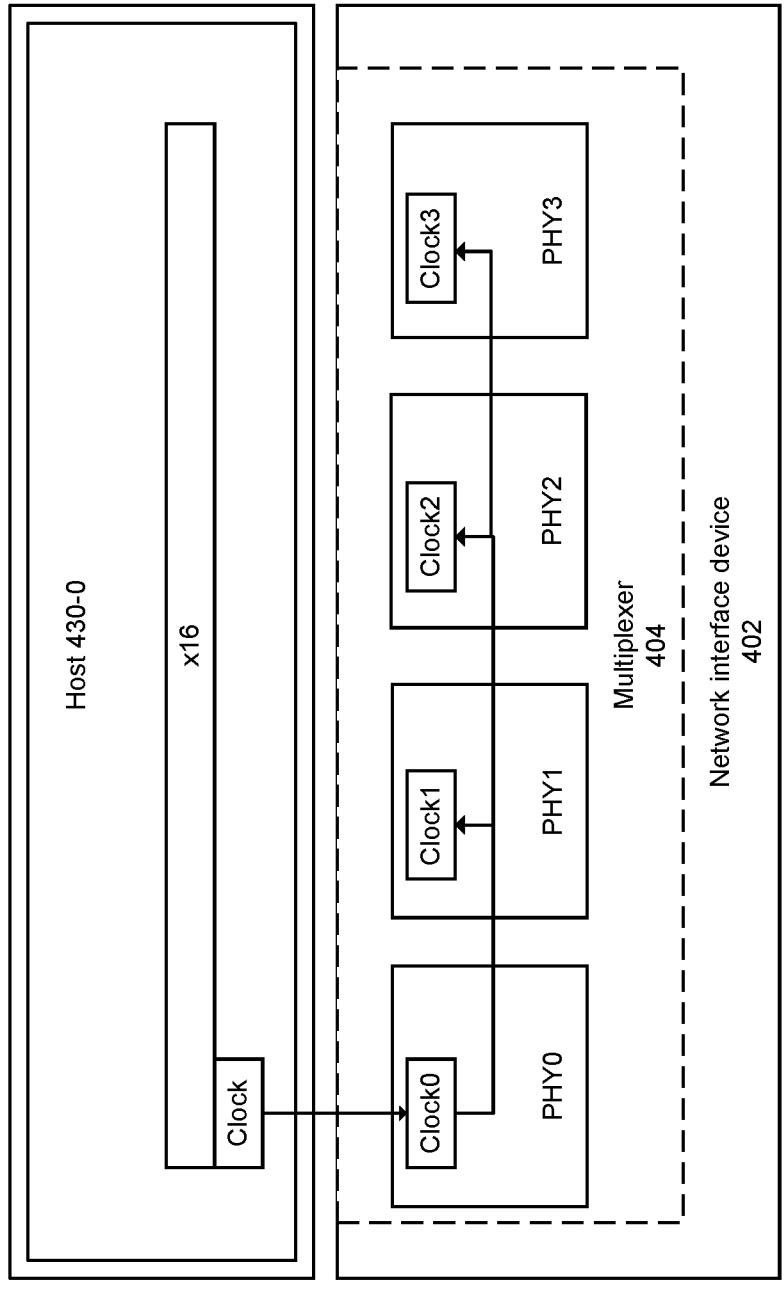
FIG. 4D depicts an example configuration that provides for distribution of a clock signal to multiple PHYs.

FIG. 4D depicts an example configuration that provides for distribution of a clock signal to multiple PHYs. Host 430-0 can connect with network interface device 402 as an x16 plug-in module, as described at least in OCP NIC 3.0 version 1.1.0 (as well as earlier versions, later versions, and derivatives thereof). In this example, integrated multiplexer 404 can be configured to support an x16 configuration of OCP NIC 3.0 version 1.1.0 (as well as earlier versions, later versions, and derivatives thereof). For example, PHY0 can receive clock signal 0 (Clock0) and also route the clock signal to PHY1, PHY2, and PHY3 to also supply clock signal 0 as clock signals 1-3 (Clock1 to Clock3).

Figure 4E:
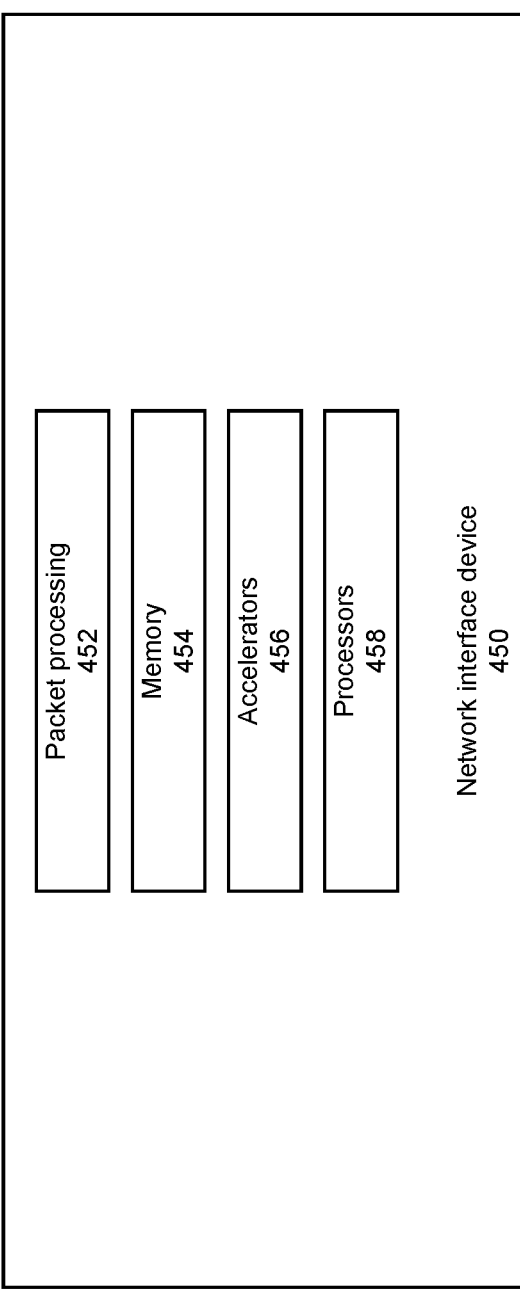
FIG. 4E depicts an example of a network interface device.

FIG. 4E depicts an example of a network interface device. The network interface device can be implemented as a data processing unit (DPU) or infrastructure processing unit (IPU). For example, DPU 450 can include packet processing 452 (e.g., Ethernet, reliable transport, encryption/decryption), memory 454 (e.g., volatile memory, cache, persistent memory), accelerators 456, and processors 458. In some examples, processors 458 can execute an orchestrator (e.g., Kubernetes, Management and Orchestration (MANO), Docker, and so forth) and compose nodes of processors, memory, and networking for use by processes (e.g., virtual machines, containers, microservices, serverless applications, applications, and so forth) executed by processors 458 or a connected server or host. In some examples, processors 458 can execute a service mesh to provide microservice-to-microservice communication.

Figure 5:
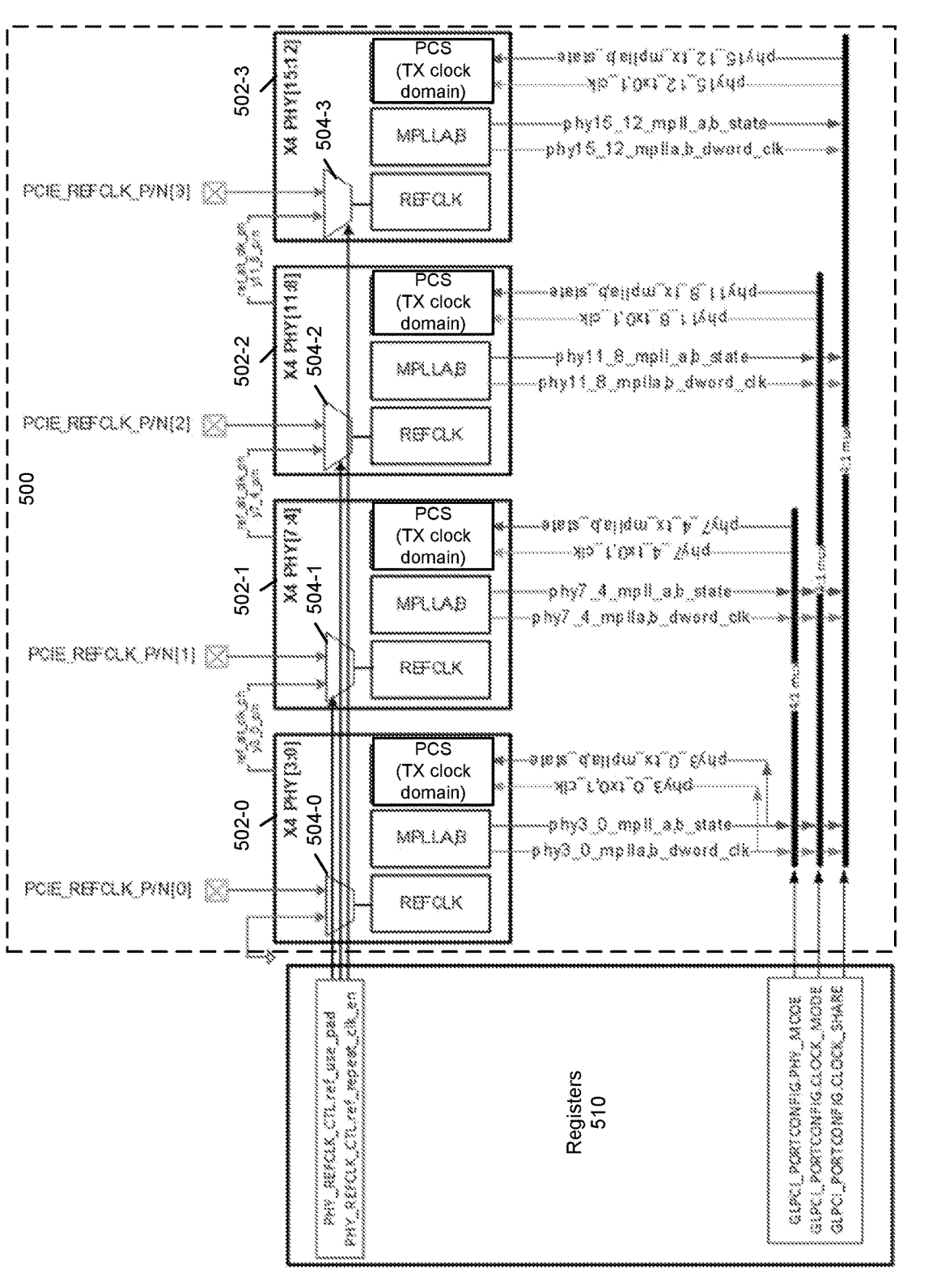
FIG. 5 depicts an example multiplexer system.

FIG. 5 depicts an example of an integrated multiplexer that can be within an SoC with a network interface device and/or integrated with a device interface. In this example, integrated multiplexer 500 includes four PHYs 502-0 to 502-3, but other numbers of PHYs can be used. Depending on a clock transfer configuration from registers 510, a PHY can receive a clock signal from a host and transfer the clock signal to another PHY. For example, PHYs 502-0 to 502-3 of integrated multiplexer 500 can provide clock signals according to configurations depicted with respect to FIGS. 4B-4D as well as other configurations described at least in OCP NIC 3.0 version 1.1.0 (as well as earlier versions, later versions, and derivatives thereof).

In some examples, PHYs 502-0 to 502-3 can include respective multiplexers 504-0 to 504-3 to output, as a reference clock (REFCLK), either reference clock signals from hosts (e.g., respective PCIE_REFCLK_P/N[0] to PCIE_REFCLK_P/N[3]) or a transferred reference clock represent a clock signal transferred from another PHY. A firmware or device driver can configure registers to select proper mode of operation.

For PHY 502-0 to 502-3, in accordance at least with PIPE Specification version 5.0, and preceding, succeeding, or derivative versions thereof, PCS can provide an interface between a controller and its PHY. Within a PHY, REFCLK can represent a clock signal output. MPLLA,B frequency can multiply REFCLK and provide a clock from a multiplexer for a controller and PCS layer.

FIGS. 6A-6C show example register values for to control whether a clock signal provided from a PHY is based on a pad input or a transferred clock signal from another pad. For example, GLPCI_PORTCONFIG.PHY_MODE, GLPCI_PORTCONFIG.CLOCK_MODE, GLPCI_PORT-CONFIG.CLOCK_SHARE, ref_use_pad[3:0], and ref_repext_clk_en[3:0] can control which phase locked loop (PLL) output to use to provide a PHY mode in accordance with OCP NIC 3.0 version 1.1.0 (as well as earlier versions, later versions, and derivatives thereof) (e.g., 1x16, x8x8, x8x4x4, or 4x4).

Table 1 shows an example of values in registers for GLPCI_PORTCONFIG.PHY_MODE and GLPCI_PORT-CONFIG.CLOCK_MODE to control which phase locked loop (PLL) output to use to provide a PHY mode in accordance with OCP NIC 3.0 version 1.1.0 (as well as earlier versions, later versions, and derivatives thereof) (e.g., 1x16, x8x8, x8x4x4, or 4x4).

TABLE 1

| GLPCI_PORTCONFIG. | | Clock MPLL Source | | | |
| --- | --- | --- | --- | --- | --- |
| PHY_MODE | CLOCK_MODE | MPLL_0 | MPLL_1 | MPLL_2 | MPLL_3 |
| 00 (1x16) | NA | 0 | 0 | 0 | 0 |
| 01 (x8x8) | 0 | 0 | 0 | 1 | 1 |
| 01 (x8x8) | 1 | 0 | 0 | 2 | 2 |
| 10 (x8x4x4) | 0 | 0 | 0 | 1 | 2 |
| 10 (x8x4x4) | 1 | 0 | 0 | 2 | 3 |
| 11 (4x4) | NA | 0 | 1 | 2 | 3 | signal from another PHY. For example, PHY 502-0 can receive clock signal PCIE_REFCLK_P/N[0] and transfer PCIE_REFCLK_P/N[0] via ref_alt_clk_phy3_0_p/n to multiplexer 504-1. For example, PHY 502-1 can receive clock signal PCIE_REFCLK_P/N[1] and transfer PCIE_REFCLK_P/N[1] via ref_alt_clk_phy7_4_p/n to multiplexer 504-2. For example, PHY 502-2 can receive clock signal PCIE_REFCLK_P/N[2] and transfer PCIE_REFCLK_P/N[2] via ref_alt_clk_phy11_8_p/n to multiplexer 504-3.

Registers 510 can control whether multiplexers 504-0 to 504-3 output a reference clock signal from a host or a transferred clock signal. For example, based on a clock transfer configuration, fuse or firmware controlled registers 510 could program PHY_REFCLK_CTL.ref_use_pad to control whether multiplexers 504-0 to 504-3 are to transfer clock signals from a pad (e.g., respective PCI_REFCLK_P/N[0] to PCI_REFCLK_P/N[3]) or a transferred or forwarded clock signal to achieve a PHY_MODE configuration at least in Table 1. PHY_REFCLK_CTL.ref_repeat_clk_en can indicate whether one or more of multiplexers 504-0 to 504-3 are to forward a clock signal received from a pad (e.g., PCIE_REFCLK_P/N[0] to PCIE_REFCLK_P/N[3]) to another multiplexer. In some examples, for PHY 502-0 to 502-3, signals ref_alt_clk_phy3_0_p/n, ref_alt_clk_phy7_4_p/n, and ref_alt_clk_phy11_8_p/n can Referring to FIG. 5 and Table 1, MPLL_0 to MPLL_3 can represent a PHY number associated with a clock signal output from respective PHYs 502-0 to 502-3. For example, an MPLL_0 of 0 can represent that a clock source is from PHY 502-0. For example, an MPLL_1 of 0 can represent that a clock source is from PHY 502-0 whereas an MPLL_1 of 1 can represent that a clock source is from PHY 502-1. For example, an MPLL_2 of 0 can represent that a clock source is from PHY 502-0, an MPLL_2 of 1 can represent that a clock source is from PHY 502-1, or an MPLL_2 of 2 can represent that a clock source is from PHY 502-2. For example, an MPLL_3 of 0 can represent that a clock source is from PHY 502-0, an MPLL_2 of 1 can represent that a clock source is from PHY 502-1, an MPLL_3 of 2 can represent that a clock source is from PHY 502-2, or an MPLL_3 of 3 can represent that a clock source is from PHY 502-3.

The clock signals from PHYs 502-0 to 502-3 can be utilized as clock signals for different host systems in connection with packet transmission clocking and time stamping or packet receipt clocking and time stamping, or data processing or storage operations.

Figure 7:
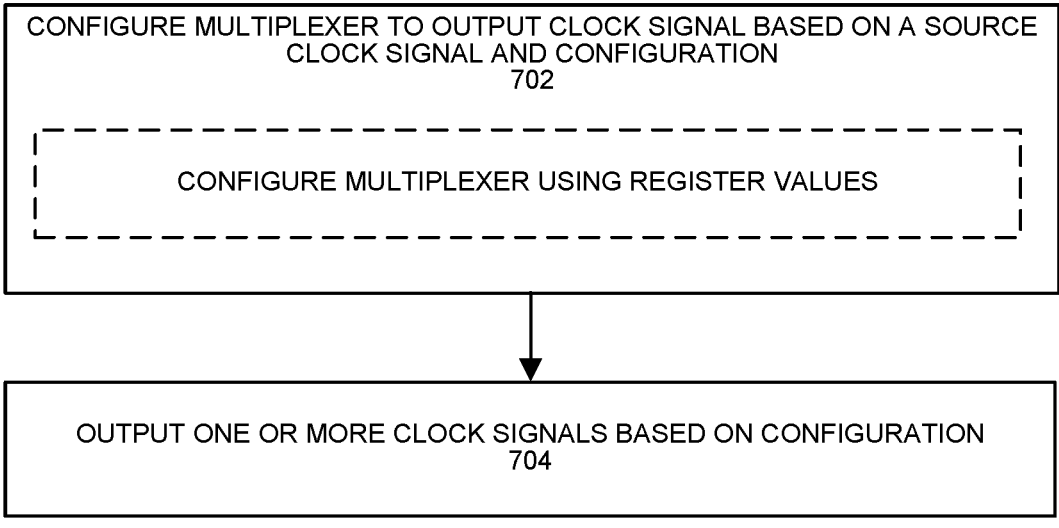
FIG. 7 depicts an example process.

FIG. 7 depicts an example process. The process can be performed by a multiplexer that is integrated into a network interface device or other device. Note that the process of FIG. 7 can be applied to one or more physical layer interfaces that are part of the multiplexer or a device interface. At 702, a multiplexer, integrated into system on chip with a device, can be configured to provide a clock signal output based on a source clock signal and a configuration mode. For example, a configuration mode can indicate whether a physical layer interface is to (a) output a clock signal based on a source clock signal received at a contact pad, (b) output a clock signal based on a source clock signal transferred from another physical layer interface, and/or (c) transfer a source clock signal to one or more other physical layer interfaces. For example, a configuration mode can include configurations such as x16, x8x8, x8x4x4, or 4x4 of OCP version 1.1.0 (as well as earlier versions, later versions, and derivatives thereof). In some examples, the configuration of the multiplexer can be performed using values in a register or registers.

At 704, in response to a received source clock signal and based on the configuration of the multiplexer, the multiplexer can output one or more clock signals for use by the device and/or one or more other physical layer interfaces. For example, the clock signal outputs can be made available for use by a network interface device to time packet transmit and/or receipt. A device interface can utilize the clock signals to time data transmission over lanes.

Figure 8:
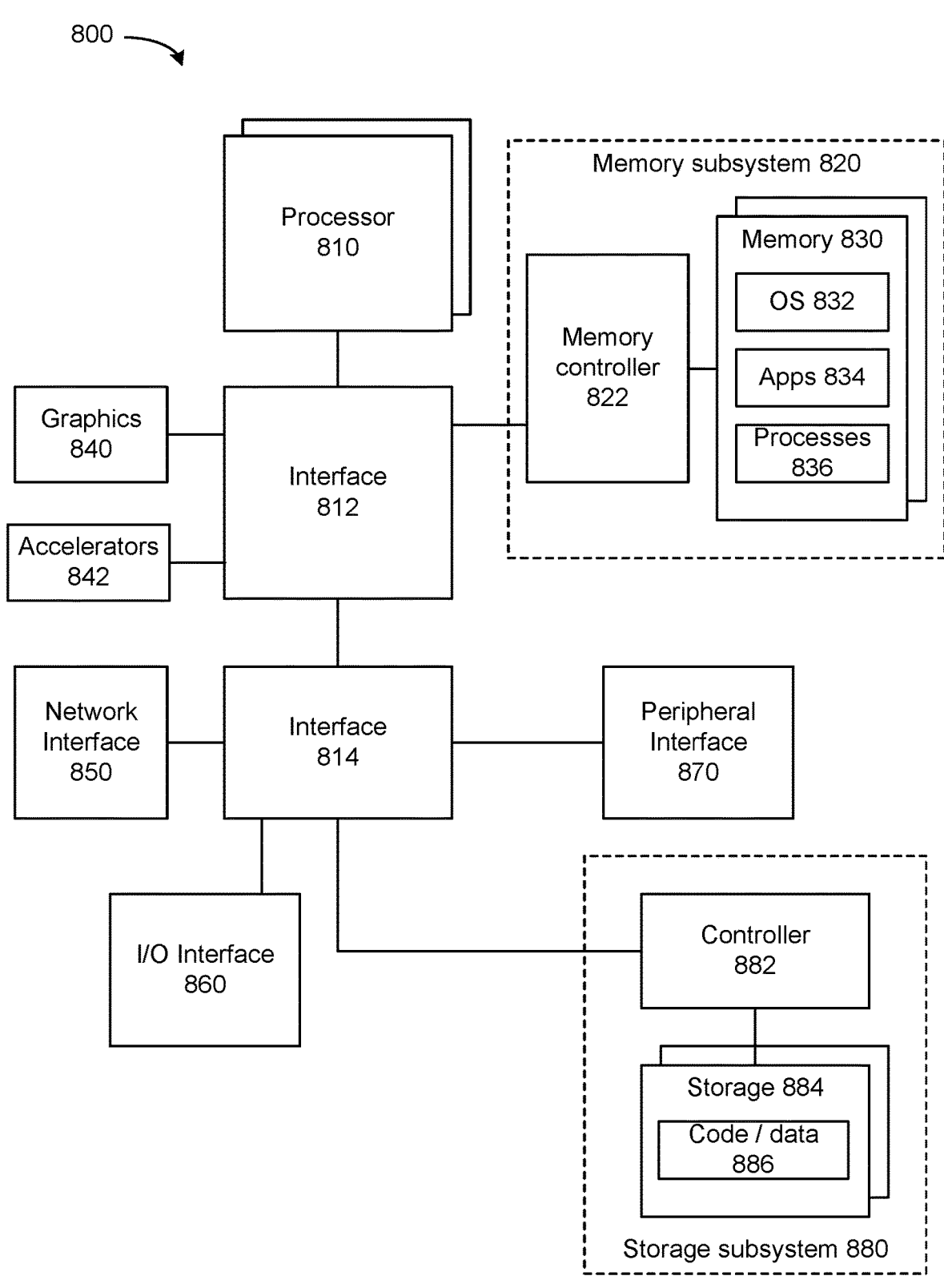
FIG. 8 depicts an example system.

FIG. 8 depicts an example computing system. System 800 can be used to program a multiplexer of network interface device 850 to provide one or more clock signals based on a source clock signal and configuration mode, as described herein. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a fixed function or programmable offload engine that can be accessed or used by a processor 810. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs) or programmable logic devices (PLDs). Accelerators 842 can provide multiple neural networks, CPUs, processor cores, general purpose graphics processing units, or graphics processing units can be made available for use by artificial intelligence (AI) or machine learning (ML) models. For example, the AI model can use or include one or more of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

In some examples, OS 832 can be Linux®, Windows® Server or personal computer, FreeBSD®, Android®, MacOS®, iOS®, VMware vSphere, openSUSE, RHEL, CentOS, Debian, Ubuntu, or any other operating system. The OS and driver can execute on a CPU sold or designed by Intel®, ARM®, AMD®, Qualcomm®, IBM®, Texas Instruments®, among others. In some examples, a device driver can configure network interface device 850 or other device to provide clock signal outputs according to a mode of operation at least based on OCP NIC 3.0 version 1.1.0 (2021) (as well as earlier versions, later versions, and derivatives thereof).

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 800 includes interface 814, which can be coupled to interface 812. In one example, interface 814 represents an interface circuit, which can include stand-alone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a device that is in the same data center or rack or a remote device, which can include sending data stored in memory.

Some examples of network interface 850 are part of an Infrastructure Processing Unit (IPU) or data processing unit (DPU) or utilized by an IPU or DPU. An xPU can refer at least to an IPU, DPU, GPU, GPGPU, or other processing units (e.g., accelerator devices). An IPU or DPU can include a network interface with one or more programmable pipelines or fixed function processors to perform offload of operations that could have been performed by a CPU. The IPU or DPU can include one or more memory devices. In some examples, the IPU or DPU can perform virtual switch operations, manage storage transactions (e.g., compression, cryptography, virtualization), and manage operations performed on other IPUs, DPUs, servers, or devices.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (e.g., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (e.g., the value or state of the data is indeterminate if power is interrupted to system 800). In one example, storage subsystem 880 includes controller 882 to interface with storage 884. In one example controller 882 is a physical part of interface 814 or processor 810 or can include circuits or logic in both processor 810 and interface 814.

A volatile memory is memory whose state (and therefore the data stored in it) is indeterminate if power is interrupted to the device. Dynamic volatile memory uses refreshing the data stored in the device to maintain state. One example of dynamic volatile memory incudes DRAM (Dynamic Random Access Memory), or some variant such as Synchronous DRAM (SDRAM). An example of a volatile memory include a cache. A memory subsystem as described herein may be compatible with a number of memory technologies, such as DDR3 (Double Data Rate version 3, original release by JEDEC (Joint Electronic Device Engineering Council) on Jun. 16, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of one or more of the above, or other memory.

A power source (not depicted) provides power to the components of system 800. More specifically, power source typically interfaces to one or multiple power supplies in system 800 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), Transmission Control Protocol (TCP), User Datagram Protocol (UDP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omni-Path, Compute Express Link (CXL), HyperTransport, high-speed fabric, NVLink, Advanced Microcontroller Bus Architecture (AMBA) interconnect, OpenCAPI, Gen-Z, Infinity Fabric (IF), Cache Coherent Interconnect for Accelerators (COX), 3GPP Long Term Evolution (LTE) (4G), 3GPP 5G, and variations thereof. Data can be copied or stored to virtualized storage nodes or accessed using a protocol such as NVMe over Fabrics (NVMe-oF) or NVMe.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission, or inclusion of block functions depicted in the accompanying figures does not infer that the hardware components, circuits, software, and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of operations may also be performed according to alternative embodiments. Furthermore, additional operations may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes one or more examples, and includes an apparatus comprising: a system-on-a-chip (SoC) comprising: a multiplexer integrated into the SoC, wherein the multiplexer comprises one or more physical layer (PHY) circuitries and the multiplexer is to receive one or more clock signals and distribute the one or more clock signals to the one or more PHY circuitries based on a clock transfer configuration to support multiple clock distribution schemes.

Example 2 includes one or more examples, wherein the one or more clock signals are received from at least one host comprising one or more of: a central processing unit (CPU), graphics processing unit (GPU), accelerator, memory pool, network-attached appliance, and/or storage device.

Example 3 includes one or more examples, wherein the multiplexer integrated into the SoC is to distribute a first clock signal to a plurality of PHY circuitries and a second clock signal to a second plurality of PHY circuitries.

Example 4 includes one or more examples, wherein the multiplexer integrated into the SoC is to distribute: a first clock signal to a first PHY circuitry; a second clock signal to a second PHY circuitry; a third clock signal to a third PHY circuitry; and a fourth clock signal to a fourth PHY circuitry.

Example 5 includes one or more examples, wherein the multiplexer integrated into the SoC is to distribute: a first clock signal to a first PHY circuitry and a second PHY circuitry and a third clock signal to a third PHY circuitry and a fourth PHY circuitry.

Example 6 includes one or more examples, wherein the multiplexer integrated into the SoC is to distribute: a first clock signal to a first PHY circuitry and a second PHY circuitry; a second clock signal to a third PHY circuitry; and a third clock signal to a fourth PHY circuitry.

Example 7 includes one or more examples, wherein the multiplexer integrated into the SoC comprises an integrated circuit that includes a network interface device, the multiplexer, and a device interface.

Example 8 includes one or more examples, wherein the one or more PHY circuitries comprise a multiplexer and circuitry to (a) receive an input clock signal from a host system or a clock signal transferred from another PHY circuitry and (b) output a clock signal based on the input clock signal or the clock signal transferred from another PHY circuitry.

Example 9 includes one or more examples, wherein the multiplexer is to support one or more of: common clocking with single host central processing unit (CPU), common but independent clocking with multiple host CPUs, and/or clocking for hybrid storage.

Example 10 includes one or more examples, comprising at least one host server, wherein the at least one host server is conductively coupled to the SoC using a circuit board and wherein the at least one host server is to configure the SoC with the clock transfer configuration.

Example 11 includes one or more examples, wherein the multiplexer integrated into the SoC comprises an integrated circuit that includes a network interface device, the multiplexer, and a device interface and comprising a data center comprising the at least one host server, wherein the data center comprises a receiver host system to receive packets from the network interface device.

Example 12 includes one or more examples, and includes a method comprising: in a system-on-a-chip (SoC) comprising a network interface device and a multiplexer integrated into the SoC: receiving one or more clock signals and distributing the one or more clock signals to one or more PHY circuitries based on a clock transfer configuration to support multiple clock distribution schemes.

Example 13 includes one or more examples, wherein the multiplexer integrated into the SoC is to distribute a first clock signal to a set of two PHY circuitries and a second clock signal to a second set of two PHY circuitries.

Example 14 includes one or more examples, comprising distributing by the multiplexer integrated into the SoC: a first clock signal to a first PHY circuitry; a second clock signal to a second PHY circuitry; a third clock signal to a third PHY circuitry; and a fourth clock signal to a fourth PHY circuitry.

Example 15 includes one or more examples, comprising distributing by the multiplexer integrated into the SoC: a first clock signal to a first PHY circuitry and a second PHY circuitry and a third clock signal to a third PHY circuitry and a fourth PHY circuitry.

Example 16 includes one or more examples, wherein the SoC comprises an integrated circuit that includes a network interface device, the multiplexer, and a device interface.

Example 17 includes one or more examples, wherein the one or more PHY circuitries comprise a multiplexer and circuitry to (a) receive an input clock signal from a host system or a clock signal transferred from another PHY circuitry and (b) output a clock signal based on the input clock signal or the clock signal transferred from another PHY circuitry.

Example 18 includes one or more examples, and includes a computer-readable medium comprising instructions stored thereon, that if executed by one or more processors, cause the one or more processors to: configure a multiplexer comprising one or more physical layer (PHY) circuitries and integrated into a system-on-a-chip (SoC) comprising a network interface device to: receive one or more clock signals and distribute the one or more clock signals to the one or more PHY circuitries based on a clock transfer configuration to support multiple clock distribution schemes.

Example 19 includes one or more examples, wherein the one or more clock signals are received from at least one host comprising one or more of: a central processing unit (CPU), graphics processing unit (GPU), accelerator, memory pool, and/or storage device.

Example 20 includes one or more examples, wherein the multiplexer integrated into the SoC is to distribute a first clock signal to a set of two PHY circuitries and a second clock signal to a second set of two PHY circuitries.

Example 21 includes one or more examples, wherein the one or more PHY circuitries comprise a multiplexer and circuitry to (a) receive an input clock signal from a host system or a clock signal transferred from another PHY circuitry and (b) output a clock signal based on the input clock signal or the clock signal transferred from another PHY circuitry.

What is claimed is:

1. An apparatus comprising:
a system-on-a-chip (SoC) comprising:
a multiplexer integrated into the SoC, wherein the multiplexer comprises one or more physical layer (PHY) circuitries and the multiplexer is to receive one or more clock signals and distribute the one or more clock signals to the one or more PHY circuitries based on a clock transfer configuration to support multiple clock distribution schemes, wherein:
based on application of a first clock transfer configuration of the multiple clock distribution schemes by the multiplexer, at least one of the one or more PHY circuitries is to forward the received one or more clock signals to a different of the one or more PHY circuitries and at least one of the one or more PHY circuitries is to not forward the received one or more clock signals to another PHY circuitry,
based on application of a second clock transfer configuration of the multiple clock distribution schemes by the multiplexer, the one or more PHY circuitries are not to forward the received one or more clock signals to another PHY circuitry, and
based on application of a third clock transfer configuration of the multiple clock distribution schemes by the multiplexer, at least one of the one or more PHY circuitries is to forward the received one or more clock signals to a different of the one or more PHY circuitries.

2. The apparatus of claim 1, wherein the one or more clock signals are received from at least one host comprising one or more of: a central processing unit (CPU), graphics processing unit (GPU), accelerator, memory pool, network-attached appliance, and/or storage device.

3. The apparatus of claim 1, wherein for the first clock transfer configuration, the multiplexer integrated into the SoC is to distribute a first clock signal to a plurality of PHY circuitries and a second clock signal to a second plurality of PHY circuitries.

4. The apparatus of claim 1, wherein for the second clock transfer configuration, the multiplexer integrated into the SoC is to distribute:
a first clock signal to a first PHY circuitry;
a second clock signal to a second PHY circuitry;
a third clock signal to a third PHY circuitry; and
a fourth clock signal to a fourth PHY circuitry.

5. The apparatus of claim 1, wherein for the second clock transfer configuration, the multiplexer integrated into the SoC is to distribute:
a first clock signal to a first PHY circuitry and a second PHY circuitry and
a third clock signal to a third PHY circuitry and a fourth PHY circuitry.

6. The apparatus of claim 1, wherein for the third clock transfer configuration, the multiplexer integrated into the SoC is to distribute:
a first clock signal to a first PHY circuitry and a second PHY circuitry;
a second clock signal to a third PHY circuitry; and
a third clock signal to a fourth PHY circuitry.

7. The apparatus of claim 1, wherein the multiplexer integrated into the SoC comprises an integrated circuit that includes a network interface device, the multiplexer, and a device interface.

8. The apparatus of claim 1, wherein the one or more PHY circuitries comprise a multiplexer and circuitry to (a) receive an input clock signal from a host system or a clock signal transferred from another PHY circuitry and (b) output a clock signal based on the input clock signal or the clock signal transferred from another PHY circuitry.

9. The apparatus of claim 1, wherein the multiplexer is to support: common clocking with single host central processing unit (CPU), common but independent clocking with multiple host CPUs, and clocking for hybrid storage.

10. The apparatus of claim 1, comprising at least one host server, wherein the at least one host server is conductively coupled to the SoC using a circuit board and wherein the at least one host server is to configure the SoC with the clock transfer configuration.

11. The apparatus of claim 10, wherein the multiplexer integrated into the SoC comprises an integrated circuit that includes a network interface device, the multiplexer, and a device interface and comprising a data center comprising the at least one host server, wherein the data center comprises a receiver host system to receive packets from the network interface device.

12. A method comprising:
in a system-on-a-chip (SoC) comprising a network interface device and a multiplexer integrated into the SoC:
receiving one or more clock signals and distributing the one or more clock signals to one or more PHY circuitries based on a clock transfer configuration to support multiple clock distribution schemes, wherein:
based on utilization of a first clock transfer scheme of the multiple clock distribution schemes by the multiplexer, at least one of the one or more PHY circuitries forwarding the received one or more clock signals to a different of the one or more PHY circuitries and at least one of the one or more PHY circuitries not forwarding the received one or more clock signals to another PHY circuitry, based on utilization of a second clock transfer scheme of the multiple clock distribution schemes by the multiplexer, the one or more PHY circuitries not forwarding the received one or more clock signals to another PHY circuitry, and based on utilization of a third clock transfer scheme of the multiple clock distribution schemes by the multiplexer, at least one of the one or more PHY circuitries forwarding the received one or more clock signals to a different of the one or more PHY circuitries.

13. The method of claim 12, wherein for the second clock transfer scheme, the multiplexer integrated into the SoC distributes a first clock signal to a set of two PHY circuitries and a second clock signal to a second set of two PHY circuitries.

14. The method of claim 12, wherein for the second clock transfer scheme, the multiplexer performs distributing:

a first clock signal to a first PHY circuitry;

a second clock signal to a second PHY circuitry;

a third clock signal to a third PHY circuitry; and a fourth clock signal to a fourth PHY circuitry.

15. The method of claim 12, wherein for the second clock transfer scheme, the multiplexer performs distributing:

a first clock signal to a first PHY circuitry and a second PHY circuitry and a third clock signal to a third PHY circuitry and a fourth PHY circuitry.

16. The method of claim 12, wherein the SoC comprises an integrated circuit that includes a network interface device, the multiplexer, and a device interface.

17. The method of claim 12, wherein the one or more PHY circuitries comprise a multiplexer and circuitry to (a) receive an input clock signal from a host system or a clock signal transferred from another PHY circuitry and (b) output a clock signal based on the input clock signal or the clock signal transferred from another PHY circuitry.

18. At least one non-transitory computer-readable medium comprising instructions stored thereon, that if executed by one or more processors, cause the one or more processors to:

configure a multiplexer comprising one or more physical layer (PHY) circuitries and integrated into a system-on-a-chip (SoC) comprising a network interface device to:

receive one or more clock signals and distribute the one or more clock signals to the one or more PHY circuitries based on a clock transfer configuration to support multiple clock distribution schemes, wherein:

utilization of a first clock transfer configuration by the multiplexer comprises at least one of the one or more PHY circuitries to forward the received one or more clock signals to a different of the one or more PHY circuitries and at least one of the one or more PHY circuitries not forwarding the received one or more clock signals to another PHY circuitry, utilization of a second clock transfer configuration by the multiplexer comprises the one or more PHY circuitries not forwarding the received one or more clock signals to another PHY circuitry, and utilization of a third clock transfer configuration by the multiplexer comprises at least one of the one or more PHY circuitries to forward the received one or more clock signals to a different of the one or more PHY circuitries.

19. The computer-readable medium of claim 18, wherein the one or more clock signals are received from at least one host comprising one or more of: a central processing unit (CPU), graphics processing unit (GPU), accelerator, memory pool, and/or storage device.

20. The computer-readable medium of claim 18, wherein for the second clock transfer configuration, the multiplexer integrated into the SoC is to distribute a first clock signal to a set of two PHY circuitries and a second clock signal to a second set of two PHY circuitries.

21. The computer-readable medium of claim 18, wherein the one or more PHY circuitries comprise a multiplexer and circuitry to (a) receive an input clock signal from a host system or a clock signal transferred from another PHY circuitry and (b) output a clock signal based on the input clock signal or the clock signal transferred from another PHY circuitry.

* * * * *